US012580498B2

(12) United States Patent (10) Patent No.: US 12,580,498 B2
Onodera et al. (45) Date of Patent: Mar. 17, 2026

(54) STACKED PIEZOELECTRIC ACTUATOR WITH THROUGH-HOLE CONNECTION ELECTRODES

(71) Applicant: New Shicoh Motor Co., Ltd., Zhejiang (CN)

(72) Inventors: Kei Onodera, Kanagawa (JP); Tomoyoshi Yano, Kanagawa (JP)

(73) Assignee: New Shicoh Motor Co., Ltd., Jiashan (CN)

( * ) Notice: Subject to any disclaimer, the term of this patent is extended or adjusted under 35 U.S.C. 154(b) by 931 days.

(21) Appl. No.: 17/848,874

(22) Filed: Jun. 24, 2022

(65) Prior Publication Data

US 2023/0009462 A1 Jan. 12, 2023

(30) Foreign Application Priority Data

Jul. 9, 2021 (JP) ................................. 2021-114147

(51) Int. Cl.
*H02N 2/02* (2006.01)
*H10N 30/50* (2023.01)
*H10N 30/87* (2023.01)

(52) U.S. Cl.
CPC ........... *H02N 2/026* (2013.01); *H10N 30/506* (2023.02); *H10N 30/874* (2023.02)

(58) Field of Classification Search
CPC ..... H02N 2/026; H10N 30/506; H10N 30/874
See application file for complete search history.

(56) References Cited

U.S. PATENT DOCUMENTS

| | | | |
|---|---|---|---|
| 7,067,960 B2 * | 6/2006 | Kobayashi | F02M 47/027 310/369 |
| 7,498,719 B2 * | 3/2009 | Piotr | H02N 2/025 310/328 |
| 7,567,017 B2 * | 7/2009 | Yoon | H02N 2/025 310/328 |
| 8,466,602 B2 * | 6/2013 | Shiraki | G02B 7/102 310/313 R |
| 9,575,284 B2 * | 2/2017 | Tada | H04N 23/57 |
| 2003/0001454 A1 | 1/2003 | Takeuchi et al. | |
| 2007/0120442 A1 | 5/2007 | Piotr et al. | |
| 2009/0127974 A1 | 5/2009 | Piotr et al. | |

FOREIGN PATENT DOCUMENTS

| | | |
|---|---|---|
| JP | 2003-159697 | 6/2003 |
| JP | 2007-516688 | 6/2007 |

OTHER PUBLICATIONS

Notice of Refusal Dated Apr. 4, 2023 From the Japan Patent Office Re. Application No. 2021-114147. (2 Pages).

* cited by examiner

*Primary Examiner* — Emily P Pham

(57) ABSTRACT

Provided is a piezoelectric actuator, a linear driving device, and an electronic device that achieve displacement of a drive shaft of a given magnitude even in a case where a low voltage is applied. A piezoelectric actuator includes a piezoelectric material composed of a stack of plate-shaped piezoelectric elements, the piezoelectric material being expandable and contractable in a direction of a plate surface thereof; an elastic plate having the piezoelectric material formed on a plate surface of the elastic plate, and a drive shaft having one end fixed to either the piezoelectric material or the elastic plate in a direction perpendicular to the plate surface of the piezoelectric material.

7 Claims, 11 Drawing Sheets

STACKED PIEZOELECTRIC ACTUATOR WITH THROUGH-HOLE CONNECTION ELECTRODES

CROSS-REFERENCE TO RELATED APPLICATION

This application is based on and claims priority under 35 USC 119 from Japanese Patent Application No. 2021-114147 filed on Jul. 9, 2021, the disclosure of which is incorporated by reference herein.

BACKGROUND

The present disclosure relates to a piezoelectric actuator, a linear driving device, and an electronic device.

An invention disclosed in Japanese Translation of PCT International Application Publication No. JP-T-2007-516688 is known as a conventional piezoelectric actuator, in which a drive shaft is fixed to a plate-shaped piezoelectric element formed on an elastic plate, and the piezoelectric element, together with the elastic plate, is caused to deform into a bowl shape so that the drive shaft is reciprocated in its axial direction by the deformation of the piezoelectric element.

However, this conventional piezoelectric actuator poses a problem that achieving greater displacement of the drive shaft requires application of a higher voltage.

SUMMARY

The present disclosure has been conceived to solve the above problem, and one embodiment of the present invention relates to provide a piezoelectric actuator, a linear driving device, and an electronic device that achieve displacement of a drive shaft of a given magnitude even in a case where a low voltage is applied.

An aspect in accordance with the present disclosure provides a piezoelectric actuator including: a piezoelectric material composed of a stack of plate-shaped piezoelectric elements and being expandable and contractable in a direction of a plate surface thereof; an elastic plate having the piezoelectric material formed on a plate surface of the elastic plate; and a drive shaft having one end fixed to either the piezoelectric material or the elastic plate in a direction perpendicular to the plate surface of the piezoelectric material.

Preferably, the piezoelectric material may formed on each of both plate surfaces of the elastic plate.

Preferably, the piezoelectric elements may include a piezoelectric element body, and electrode connection layers placed across the piezoelectric element body and being supplied with applied voltages that are different from each other. Two through-holes may be formed in the piezoelectric elements, and connection electrodes may be provided in the through-holes, respectively, such that an odd number electrode layer is connected to one of the connection electrodes, and an even number electrode layer is connected to another of the connection electrodes.

Preferably, the one connection electrode and the even number electrode layer may be formed so as to be isolated from each other, and the other connection electrode and the odd number electrode layer may be formed so as to be isolated from each other.

Preferably, the number of piezoelectric elements stacked may be odd.

Another aspect in accordance with the present disclosure may provides a linear driving device including the piezoelectric actuator.

A still another aspect in accordance with the present disclosure may provides an electronic device including the linear driving device.

According to the present disclosure, stacking piezoelectric elements makes each piezoelectric element smaller in thickness. As a result, when supplied with a low voltage, these piezoelectric elements expand/contract in a magnitude equal to the magnitude of expansion/contraction in a conventional case. Hence, even in a case where a low voltage is applied, displacement of the drive shaft of a given magnitude can be achieved.

BRIEF DESCRIPTION OF THE DRAWINGS

Exemplary embodiments of the present disclosure will be described in detail based on the following figures.

FIG. 2 is a plan view of a piezoelectric material used in the first embodiment of the present disclosure;

FIG. 3 is a bottom view of the piezoelectric material used in the first embodiment of the present disclosure:

FIG. 6 is a side view of a piezoelectric actuator according to a second embodiment of the present disclosure;

DETAILED DESCRIPTION

Embodiments of the present disclosure will be described with reference to the drawings.

Figure 1:
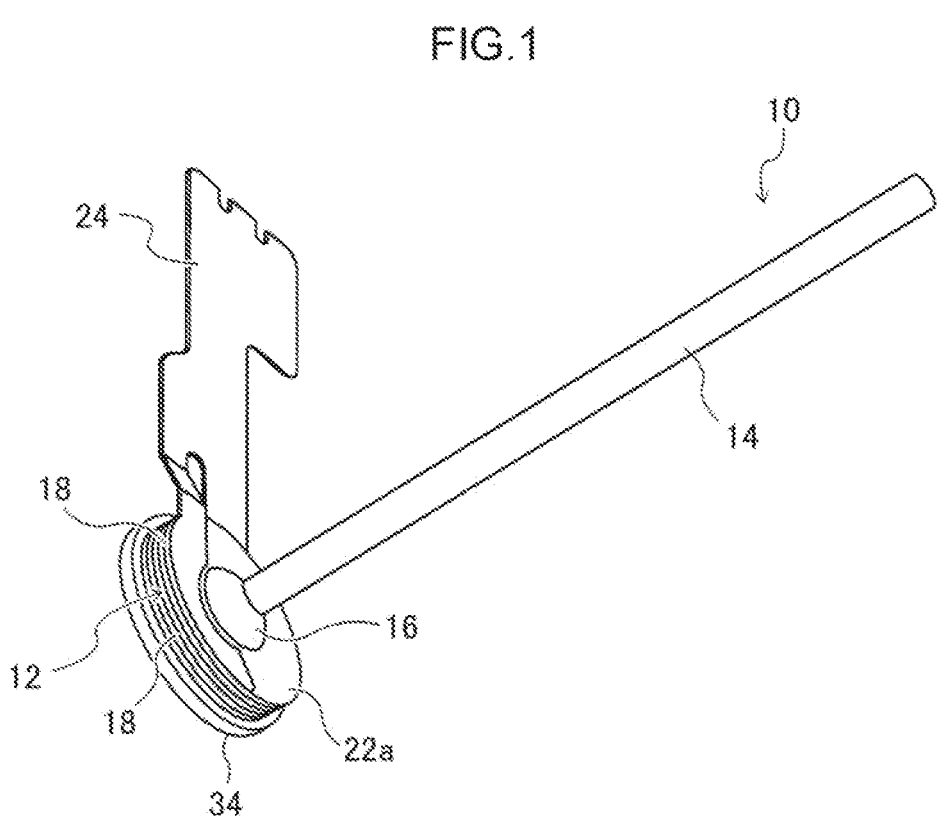
FIG. 1 is a perspective view of a piezoelectric actuator according to a first embodiment of the present disclosure.

FIG. 1 depicts a piezoelectric actuator 10 according to a first embodiment of the present disclosure. The piezoelectric actuator 10 according to the first embodiment is of a unimorph type.

The piezoelectric actuator 10 includes a piezoelectric material 12, an elastic plate 34, and a drive shaft 14. The piezoelectric material 12 and the elastic plate 34 are formed into, for example, disc shapes, and the piezoelectric material 12 is placed on a plate surface of the elastic plate 34. The drive shaft 14 has its one end connected to the center of the piezoelectric material 12, via an adhesive 16. The piezoelectric material 12 includes a piezoelectric element body 20 composed of a stack of piezoelectric elements 18 of plate shapes. The piezoelectric elements 18 each have a diameter ranging from about several mm to 1 cm and a thickness ranging, for example, from 0.005 mm to 0.05 mm. The piezoelectric material 12 as a whole thus has a diameter ranging from 0.05 mm to 0.5 mm. The elastic plate 34 has a diameter ranging from about several mm to 1 cm and a thickness ranging, for example, from 0.05 mm to 0.2 mm. The drive shaft 14 is about 1 mm in thickness. The piezoelectric material 12 has external electrode layers 22a and 22b connected respectively to front (upper) and back (lower) sides of the piezoelectric material 12 (electrode layers 22a and 22b shown in FIGS. 2 to 4). The external electrode layers 22a and 22b are connected to a flexible wiring board 24. The elastic plate 34 can deform into a bowl shape as a result of expansion/contraction of the piezoelectric materials 12 and 12 in a direction along the plate surface. The elastic plate 34 is made of, for example, phosphor bronze.

Figure 2:
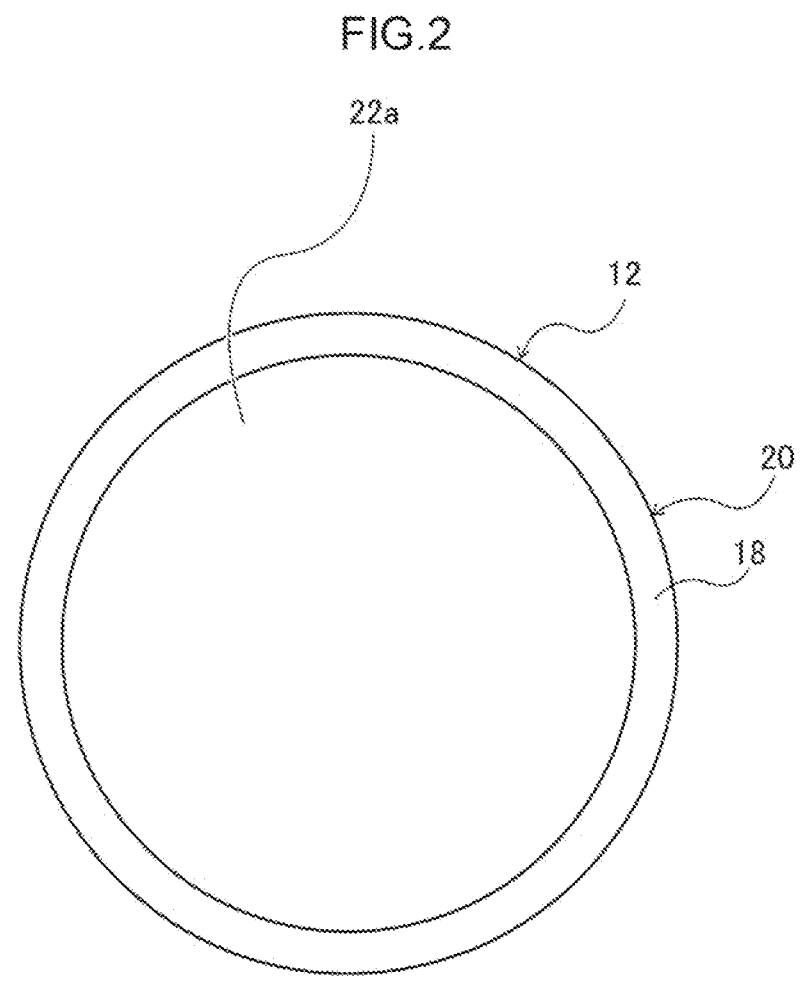
Figure 3:
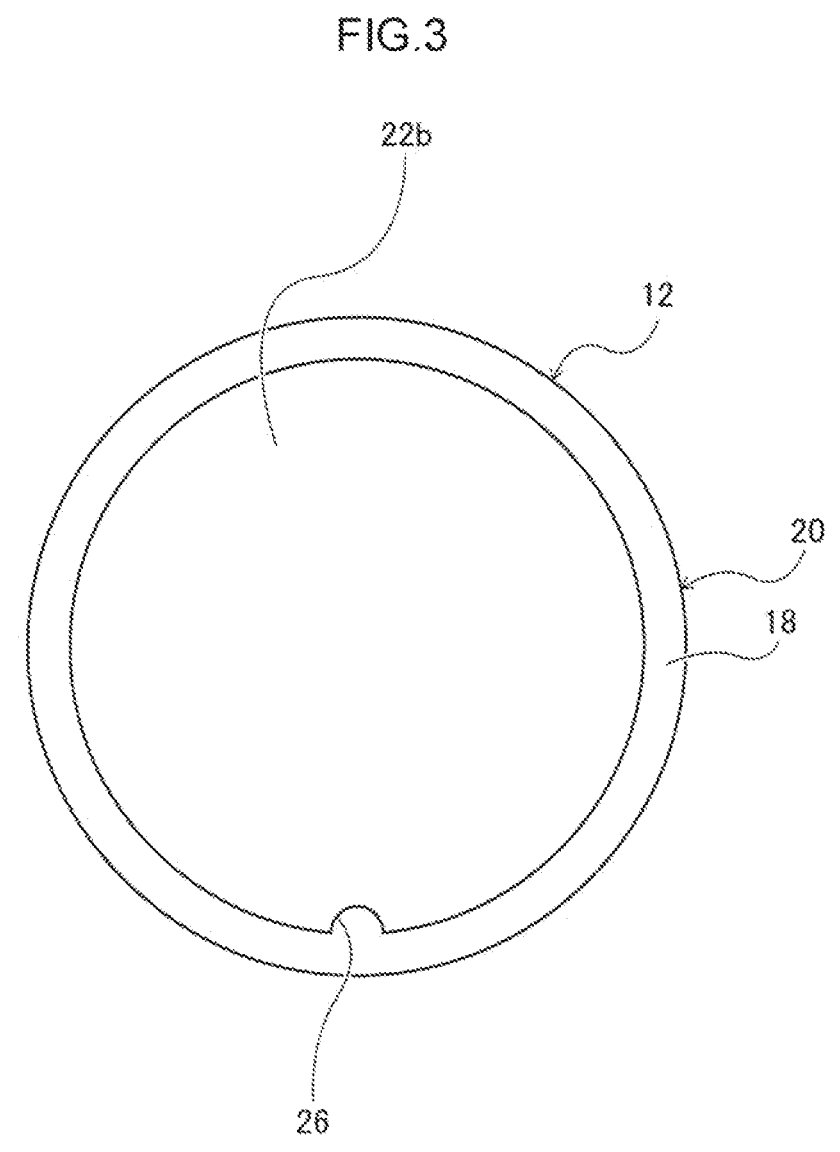

As shown in FIGS. 2 and 3, the external electrode layers 22a and 22b disposed on the upper and the lower sides are each formed into a disc shape slightly smaller in outline than the piezoelectric element 18. Only the external electrode layer 22b disposed on the lower side has a cutout 26 formed on the periphery of the external electrode layer 22b. The cutout 26 is formed in order to distinguish the external electrode layer 22a on the upper side and the external electrode layer 22b on the lower side from each other.

Figure 4:
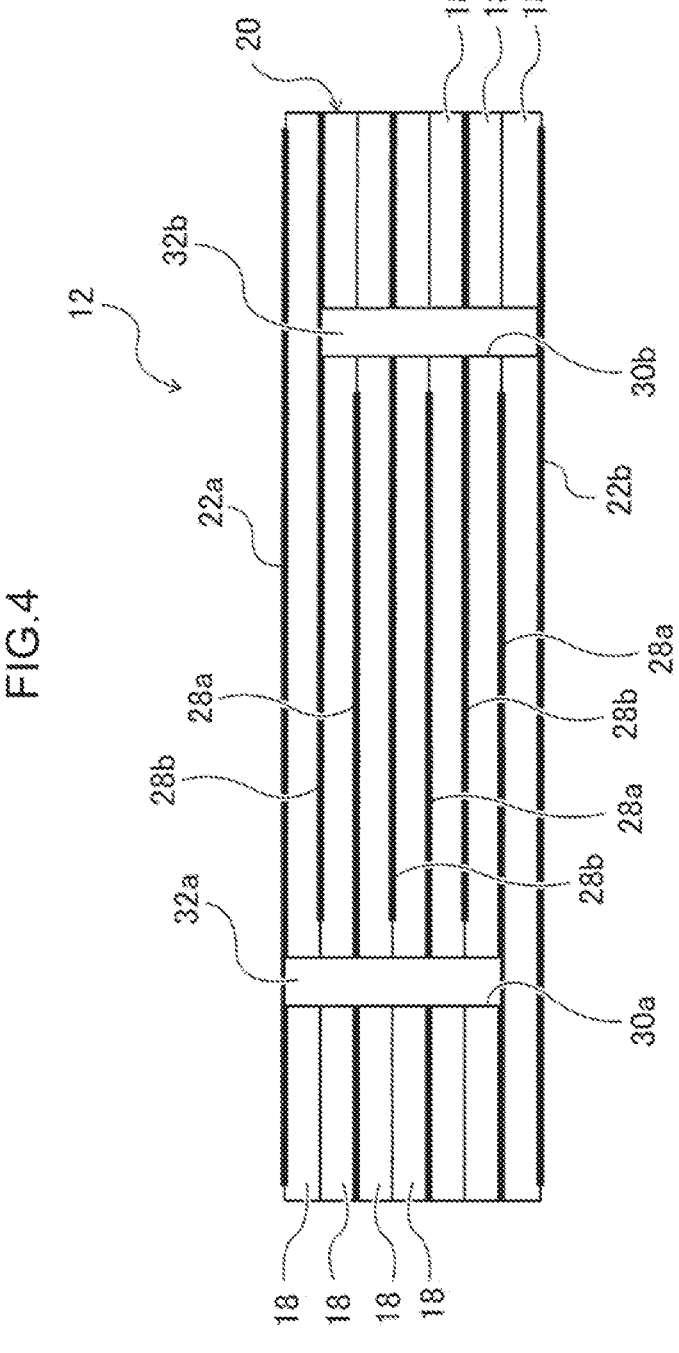
FIG. 4 is a cross-sectional view of the piezoelectric material used in the first embodiment of the present disclosure.

As shown in FIG. 4, the piezoelectric element body 20 is composed of a stack of an odd number of piezoelectric elements 18. In the first embodiment, the piezoelectric element body 20 is composed of seven piezoelectric elements 18. Internal electrode layers 28a and internal electrode layers 28b are arranged alternately such that an internal electrode layer 28a or an internal electrode layer 28b is interposed between each pair of piezoelectric elements 18. A reference sign "a" is appended to odd number electrode layers, which include the external electrode layer 22a. The external electrode layer 22a and the internal electrode layers 28a are thus defined accordingly. A reference sign "b" is appended to even number electrode layers. The external electrode layer 22b and the internal electrode layers 28b are thus defined accordingly. An piezoelectric element 18 on the uppermost part is sandwiched between the external electrode layer 22a and an internal electrode layer 28b, and a piezoelectric element that is the second from the top is sandwiched between this internal electrode layer 28b and an internal electrode layer 28a. In this manner, the third to sixth piezoelectric elements 18 are each sandwiched vertically between an internal electrode layer 28a and an internal electrode layer 28b, and a piezoelectric element 18 on the lowermost part is sandwiched between an internal electrode layer 28a and the external electrode layer 22b. A voltage needs to be applied to each one of the piezoelectric elements 18 in its thickness direction. For this reason, connection is made such that the external electrode layer 22a and the internal electrode layers 28a are at the same potential as the external electrode layer 22b and the internal electrode layers 28b are at the same potential. Because a voltage needs to be applied across two external electrode layers 22a and 22b, the total number of electrode layers is even, while the number of piezoelectric elements 18 is odd.

The piezoelectric elements 18, except the piezoelectric elements 18 on the top and bottom, each have two through-holes 30a and 30b. The piezoelectric element 18 on the top has one through-hole 30a as the piezoelectric element 18 on the bottom has the other through-hole 30b. For example, a positive connection electrode 32a is buried in the through-hole 30a of each piezoelectric element 18.

A negative connection electrode 32b is buried in the through-hole 30b. The external electrode layer 22a on the upper side is connected to three internal electrode layers 28a via the connection electrode 32a, and the external electrode layer 22b on the lower side is connected to three internal electrode layers 28b via the connection electrode 32b.

The through-holes 30a and 30b are each located substantially at the midpoint between the center and the peripheral edge of the piezoelectric material 12. Because vibrations at the midpoint is smaller than vibrations at the center of the piezoelectric material 12, damage caused by vibrations in this case is smaller than that in the case of providing the through-hole at the center.

Each internal electrode layer 28a and the connection electrode 32b are formed such that they are physically/electrically isolated from each other, and each internal electrode layer 28b and the connection electrode 32a are formed such that they are physically/electrically isolated from each other.

In the above configuration, for example, when a pulse voltage is repeatedly applied across the external electrode layer 22a and the external electrode layer 22b, the pulse voltage inputted to all piezoelectric elements 18 via the connection electrodes 32a and 32b causes the piezoelectric elements 18 to extend and contract simultaneously in the same radial direction of the piezoelectric elements 18 as the elastic material 34 does not extend and contract. As a result, the piezoelectric elements 18, together with the elastic plate 34, deform into a bowl shape and then snap back into the original shape due to the elasticity of the elastic material 34. The piezoelectric elements 18 repeat this movements. This causes the drive shaft 14 to make minute reciprocating movements repeatedly in its axial direction. At this time, for example, when the pulse width of the pulse signal is changed as the frequency of the same is kept constant, moving speed can be changed between outward paths and return paths of the reciprocating movements. A moving body (not illustrated) is frictionally connected to the drive shaft 14, and this moving body moves in one direction along the drive shaft 14 because of the above speed difference in the reciprocating movements of the drive shaft 14.

In the first embodiment, the piezoelectric material 12 is formed by stacking the piezoelectric elements 18, and the pulse voltage is applied to each of the stacked piezoelectric elements 18. When supplied with a lower voltage, this piezoelectric material 12 expands and contracts in the same manner as a piezoelectric material 12 composed of a single piezoelectric element 18 equal in thickness with the above stacked piezoelectric elements 18 does. In other words, stacking the piezoelectric elements 18 makes each piezoelectric element 18 smaller in thickness, in which case applying a lower voltage achieves the same magnitude of expansion/contraction of the piezoelectric element 18 as in the conventional case. It is possible, therefore, that applying a voltage lower than that in the conventional case achieves replacement of the drive shall 14 in the form of minute reciprocating movements in its axial direction, the reciprocating movements being equal in magnitude in those in the conventional case.

Figure 5:
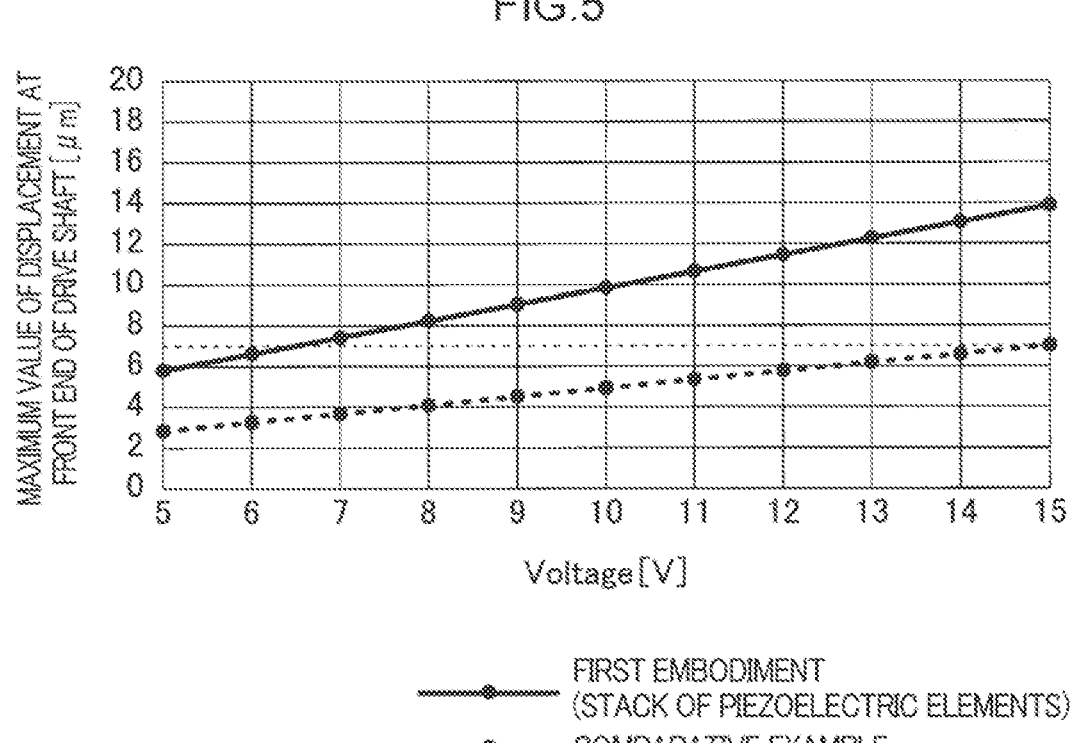
FIG. 5 is a characteristic diagram showing comparison between a characteristic line of the piezoelectric actuator according to the first embodiment of the present disclosure and a characteristic line of a comparative example.

FIG. 5 depicts comparison between characteristics of the piezoelectric actuator 10 according to the first embodiment and characteristics of a piezoelectric actuator 10 according to a comparative example. In the comparative example, the piezoelectric material 12 is composed of a single piezoelectric element 18 but is identical in thickness and outline with the piezoelectric actuator 10 according to the first embodiment.

In the comparative example using the single piezoelectric element 18, when intended maximum displacement at the end of the drive shaft is 7 μm, a voltage of 15 V needs to be applied. In the case of the piezoelectric actuator 10 according to the first embodiment, on the other hand, the same maximum displacement of 7 μm can be achieved by applying a voltage of 6.5 V.

Figure 6:
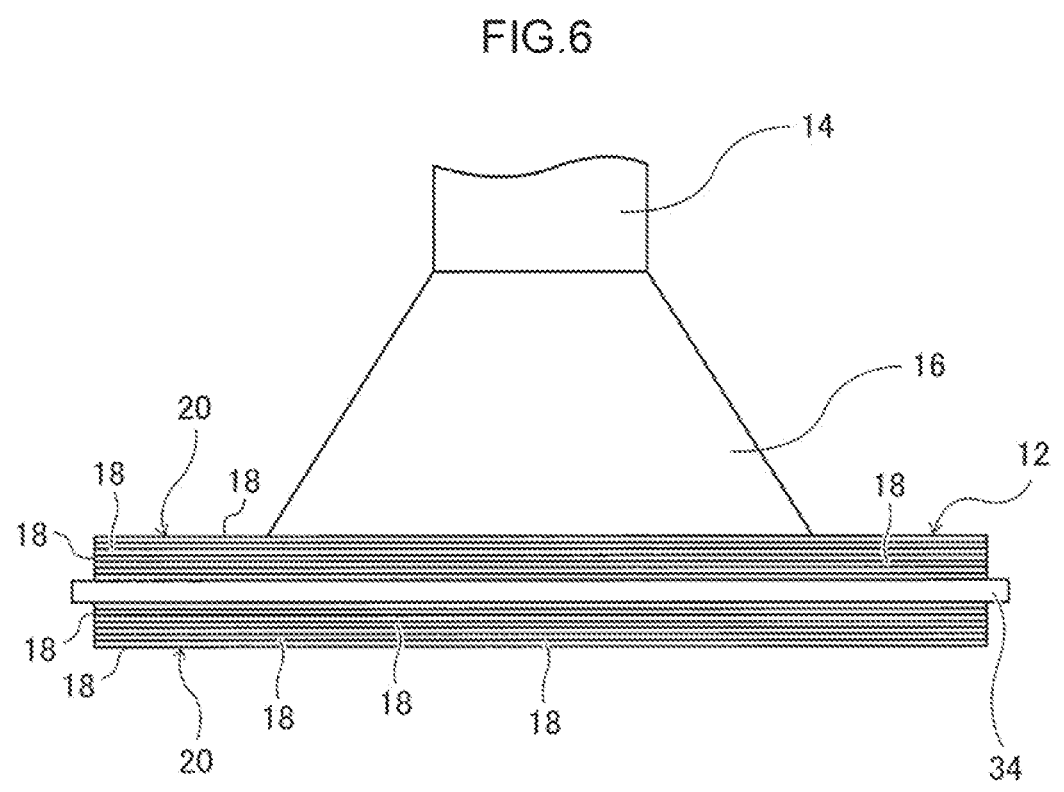

FIG. 6 depicts a piezoelectric actuator 10 according to a second embodiment of the present disclosure. The piezoelectric actuator 10 of the second embodiment is a bimorph type in which the elastic plate 34 is sandwiched between two piezoelectric materials 12 and 12. In other words, the piezoelectric materials 12 are formed on plate surfaces on both sides of the elastic plate 34, respectively. The elastic plate 34, together with the piezoelectric materials 12 and 12, can deform into a bowl shape due to expansion/contraction of the piezoelectric materials 12 and 12. The elastic plate 34 is made of, for example, phosphor bronze, and serves also as an external electrode.

Figure 7:
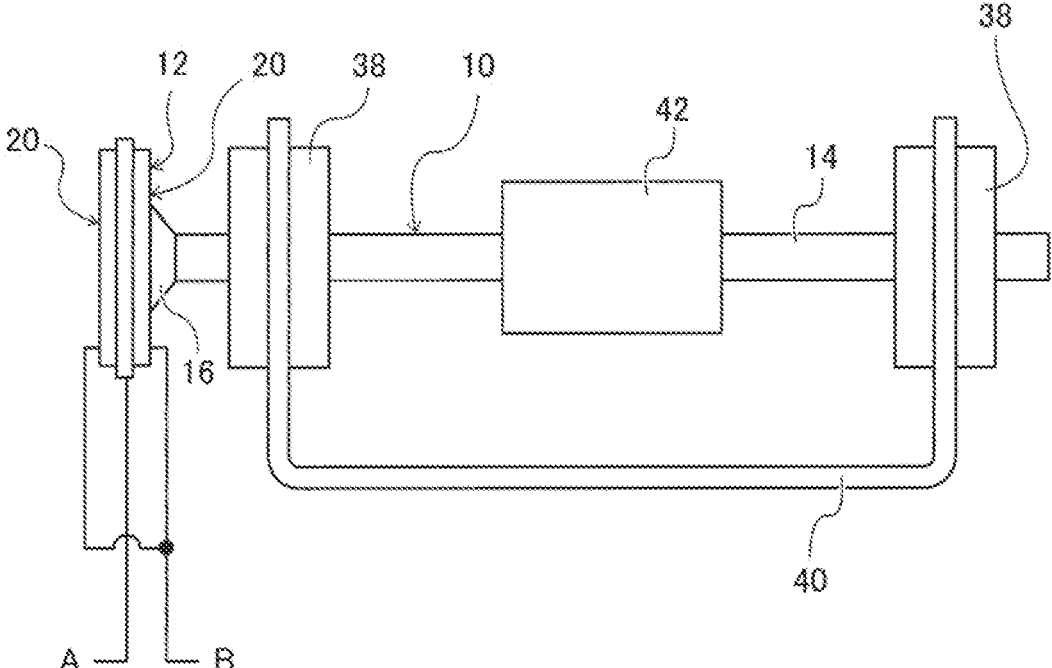
FIG. 7 is aside view of a driving device including the piezoelectric actuator according to the second embodiment of the present disclosure.

FIG. 7 depicts a driving device 36 including the piezoelectric actuator 10. The driving device 36 includes two supports 38 and 38, through which the drive shaft 14 is inserted. The supports 38 and 38 support the drive shaft 14 in such a way as to allow it to move freely in its axial direction. The supports 38 and 38 are made of, for example, rubber. The supports 38 and 38 are fixed by a fixing member 40. Between the supports 38 and 38, a moving body 42 is fitted on the drive shaft 14 penetrating the moving body 42.

Figure 8:
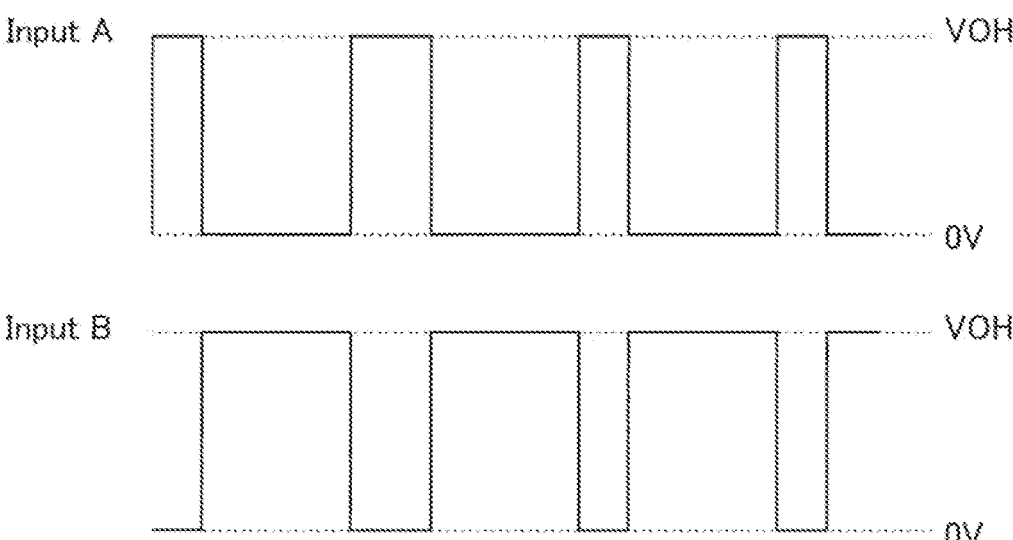
FIG. 8 is a timing chart showing input voltages applied to the driving device using the piezoelectric actuator according to the second embodiment of the present disclosure.

An input voltage A is applied to the elastic plate 34, while an input voltage B is applied to an external electrode layer (not illustrated in FIG. 7). As shown in FIG. 8, the input voltage A and the input voltage B are pulse voltages having preset duty ratios and opposite in polarity to each other. These input voltages A and B cause the piezoelectric materials 12 and the elastic plate 34 to deform into a bowl shape, which in turns causes the moving body 42 to move in the axial direction of the drive shaft 14.

Figure 9:
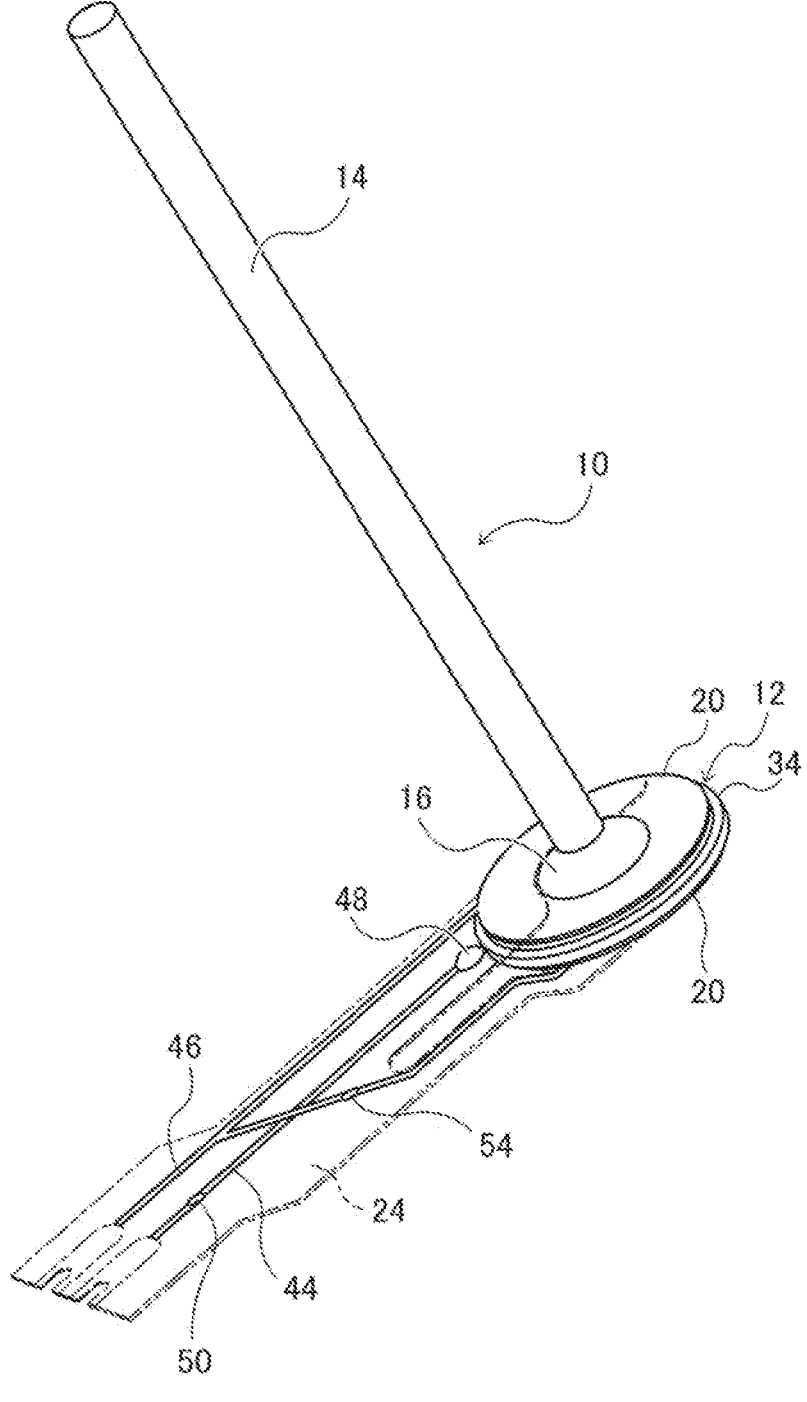
FIG. 9 illustrates a wiring structure of the actuator according to the second embodiment of the present disclosure and is a perspective view thereof seen from diagonally above through the flexible wiring board that is depicted with transparency.
Figure 10:
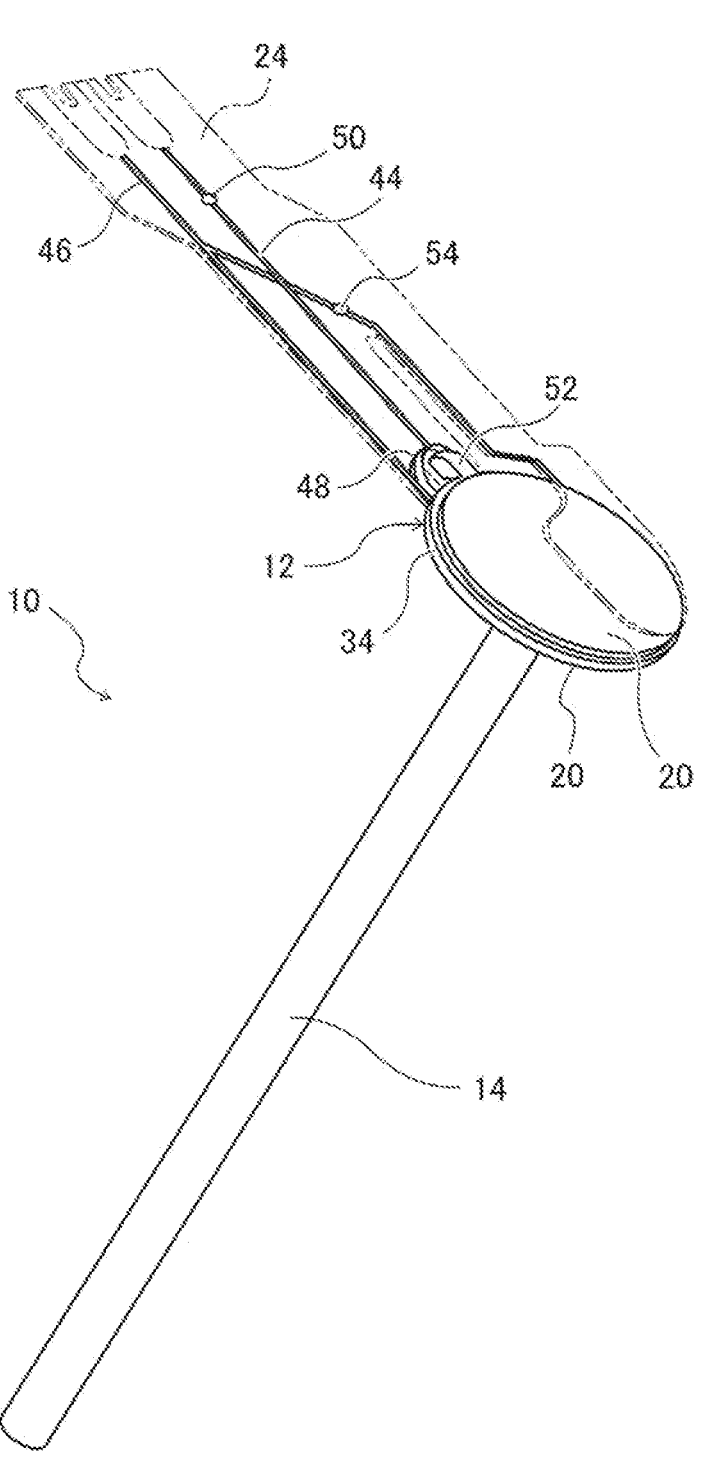
FIG. 10 illustrates a wiring structure of the actuator according to the second embodiment of the present disclosure and is a perspective view thereof seen from diagonally below through the flexible wiring board that is depicted with transparency.
Figure 11:
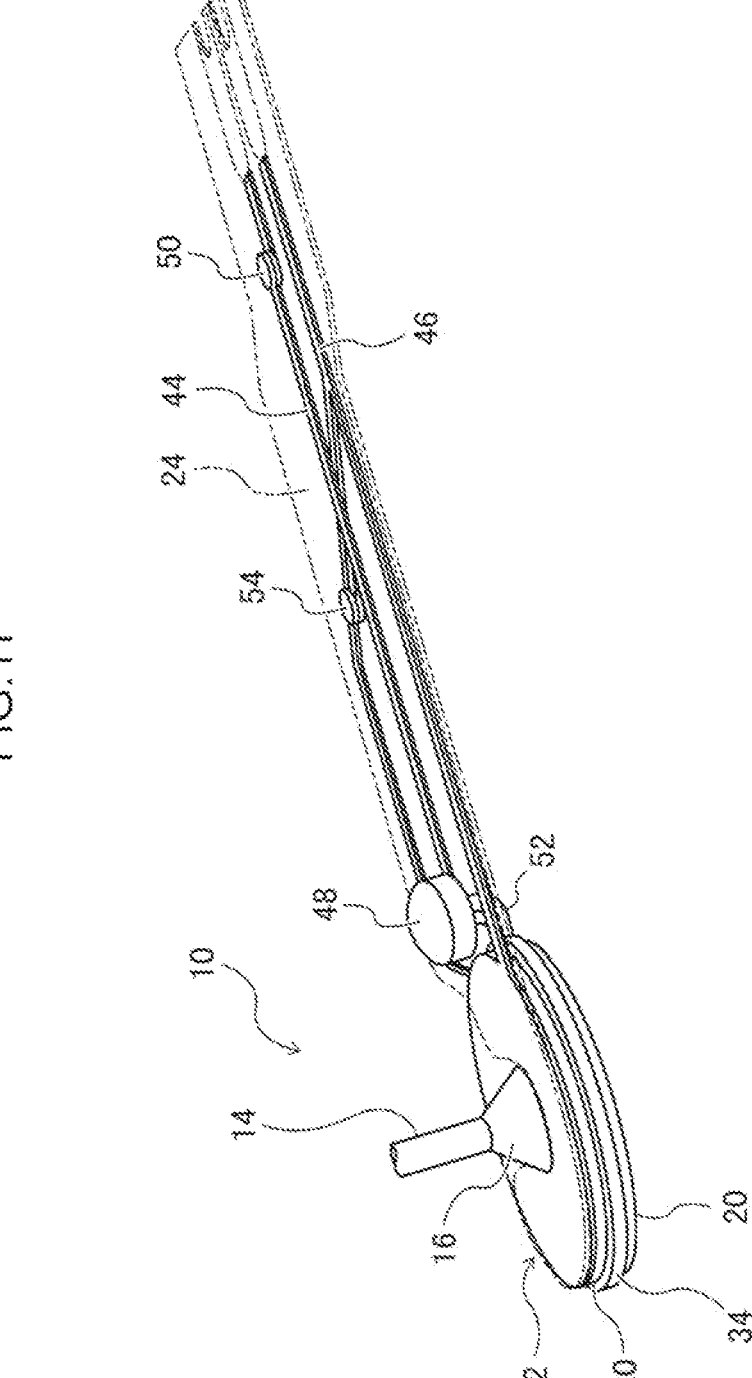
FIG. 11 illustrates a wiring structure of the actuator according to the second embodiment of the present disclosure and is a perspective view thereof seen from diagonally sideways through the flexible wiring board that is depicted with transparency.

FIGS. 9 to 11 depict a wiring structure of the piezoelectric actuator 10 according to the second embodiment.

The piezoelectric actuator 10 is connected to an external element via the flexible wiring board 24. The flexible wiring board 24 is provided with a first wire 44 for applying the input voltage A and a second wire 46 for applying the input voltage B. As shown in FIG. 11, the first wire 44 extends from one end toward the piezoelectric materials 12 and is connected to a soldered par 48. The first wire 44 is put in an elevated position by a first height changing part 50 on the way to the soldered part 48, thus intersecting the second wire 46 in such a way as to be different in height with the second wire 46. The elastic plate 34 is provided with a projection 52 projecting from the periphery of the elastic plate 34 and bending upward. The projection 52 is connected to the soldered part 48 through a through-hole formed on the flexible wiring board 24.

Similar to the first wire 44, the second wire 46 extends from one end toward the piezoelectric materials 12. The second wire 46 branches into two parts in the middle, and one of the branched two parts is connected from above to the upper piezoelectric material 12 on the upper side. The other of the two parts is provided with a second height changing part 54, is put in an elevated position by this second height changing part 54, and is connected from below to the piezoelectric material 12 on the lower side.

According to the above embodiment, the piezoelectric element is of a disc shape. The present disclosure, however, does not limit the shape of the piezoelectric element to the disc shape. For example, the piezoelectric element of any shape, such as a rectangular one, may be adopted providing that the piezoelectric element is plate-shaped and can be stacked up. It is nevertheless preferable that the shape of the piezoelectric element is highly symmetrical as much as possible. The drive shaft 14 may be bonded not to the piezoelectric material 12 but to the elastic plate 34. The piezoelectric elements 18 are not necessarily identical in thickness but may be different in thickness from each other. In addition, the number of piezoelectric elements 18 making up the piezoelectric material 12 on the upper side is not necessarily the same as the number of piezoelectric elements 18 making up the piezoelectric material 12 on the lower side. To put it in an extreme way, one of the piezoelectric materials 12 may be composed of a single piezoelectric element 18.

The invention claimed is:

1. A piezoelectric actuator comprising:
   a piezoelectric material composed of a stack of plate-shaped piezoelectric elements and being expandable and contractable in a direction of a plate surface thereof;
   an elastic plate having the piezoelectric material formed on a plate surface of the elastic plate; and
   a drive shaft having one end fixed to either the piezoelectric material or the elastic plate in a direction perpendicular to the plate surface of the piezoelectric material,
   wherein each of the plate-shaped piezoelectric elements includes:
      a piezoelectric element body; and
      electrode layers placed across the plate-shaped piezoelectric element body and being supplied with applied voltages that are different from each other,
   and wherein two through-holes are formed in the plurality of plate-shaped piezoelectric elements, and
   connection electrodes are provided in the respective through-holes such that an odd numbered electrode layer is connected to one of the connection electrodes, and an even numbered electrode layer is connected to another of the connection electrodes.

2. The piezoelectric actuator according to claim 1, wherein the piezoelectric material is formed on each of both plate surfaces of the elastic plate.

3. The piezoelectric actuator according to claim 2, wherein an odd number of the plate-shaped piezoelectric elements are stacked.

4. The piezoelectric actuator according to claim 1, wherein the one connection electrode and the even numbered electrode layer are formed so as to be isolated from each other, and the other connection electrode and the odd numbered electrode layer are formed so as to be isolated from each other.

5. The piezoelectric actuator according to claim 1, wherein an odd number of the plate-shaped piezoelectric elements are stacked.

6. A linear driving device comprising the piezoelectric actuator according to claim 1.

7. An electronic device comprising the linear driving device according to claim 6.

* * * * *